(12) United States Patent
Sasaki (10) Patent No.: US 7,670,652 B2
(45) Date of Patent: Mar. 2, 2010

(54) METHOD OF MANUFACTURING PATTERNED FILM

(75) Inventor: Tsutomu Sasaki, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 593 days.

(21) Appl. No.: 11/701,481

(22) Filed: Feb. 2, 2007

(65) Prior Publication Data

US 2007/0202252 A1 Aug. 30, 2007

(30) Foreign Application Priority Data

Feb. 24, 2006 (JP) ............... 2006-047759

(51) Int. Cl.
  *B05D 1/04* (2006.01)
  *B05D 1/32* (2006.01)
(52) U.S. Cl. ..................... 427/468; 427/282
(58) Field of Classification Search ............... 427/468, 427/282
   See application file for complete search history.

(56) References Cited

U.S. PATENT DOCUMENTS

| | | | | |
|---|---|---|---|---|
| 3,170,810 A | * | 2/1965 | Kagan | ............ 427/598 |
| 5,178,913 A | * | 1/1993 | Kusunoki et al. | ............ 427/282 |
| 5,200,025 A | * | 4/1993 | Toei et al. | ............ 216/12 |
| 5,817,204 A | * | 10/1998 | Tselesin | ............ 156/230 |

FOREIGN PATENT DOCUMENTS

| | | |
|---|---|---|
| JP | 2003-142750 A | 5/2003 |
| JP | 2004-91854 A | 3/2004 |
| JP | 2004-146750 A | 5/2004 |
| JP | 2005-317952 A | 11/2005 |

* cited by examiner

*Primary Examiner*—Frederick J Parker
(74) *Attorney, Agent, or Firm*—Sughrue Mion, PLLC

(57) ABSTRACT

A method of manufacturing a patterned film by which an accurately patterned film is formed when film formation is performed by using the AD method. The method includes the steps of: (a) disposing a multilayered mask containing at least one soft mask layer formed of a soft material and at least one hard mask layer formed of a hard material on a substrate or an electrode formed on the substrate; (b) spraying powder formed of a brittle material toward the substrate, on which the multilayered mask has been disposed, and allowing the powder to collide with an under layer to deposit the powder thereon, thereby forming a brittle material layer; and (c) removing the multilayered mask after step (b).

17 Claims, 10 Drawing Sheets

METHOD OF MANUFACTURING PATTERNED FILM

BACKGROUND OF THE INVENTION

1. Field of the Invention

The present invention relates to a method of manufacturing a patterned film by using an aerosol deposition method of forming a film by spraying powder of a raw material toward a substrate.

2. Description of a Related Art

In recent years, with the developments of MEMS (micro electro mechanical systems) related devices, elements such as multilayered ceramics capacitors and piezoelectric actuators have been microfabricated still further and packaged more densely. Accordingly, the manufacture of such elements using film forming technologies has been actively studied.

Recently, an aerosol deposition (AD) method as one of the film forming technologies utilizing the collision and deposition phenomenon of solid particles has received attention. The AD method is a film forming method of injecting an aerosol generated by dispersing fine powder of a raw material from a nozzle toward a substrate and allowing the powder to collide with the substrate or the previously formed film to deposit the raw material on the substrate. Here, the aerosol refers to "a colloid system including a dispersion phase consisting of solid or liquid particles and a dispersion medium consisting of a gas" (written by Kanji Takahashi, "Basis of Aerosol Studies", Morikita Publishing, 1st edition, p. 1). According to the AD method, dense and strong films with low porosity can be formed, and therefore, the performance of the above-mentioned microelements may be improved.

As a related technology, Japanese Patent Application Publication JP-P2003-142750A discloses a method of forming a piezoelectric actuator having a high-definition piezoelectric material array with a homogeneous thickness. The method of forming a piezoelectric actuator includes the steps of: forming a resist pattern on a substrate; forming a piezoelectric film on the substrate to cover the resist pattern by using a gas deposition method; and patterning the piezoelectric film by removing the resist pattern to fabricate a piezoelectric material array in which piezoelectric material stripes are arranged at predetermined intervals.

Japanese Patent Application Publication JP-P2004-91854A discloses a method of forming a composite structure for forming a brittle material structure, which has an edge portion sharply cut, by using the aerosol deposition method. In the method of forming a composite structure, the brittle material structure, which has brittle material fine particles deposited only on the part of the opening of a mask, is formed by allowing the brittle material fine particles to collide with a base material, onto which the mask has been attached, at a high speed, and further, the mask is removed.

Japanese Patent Application Publication JP-P2004-146750A discloses a method of manufacturing a device unit including a device having a film of a brittle material as a component element on a resin substrate. In the method of manufacturing a device unit, a substrate having hardness DHv2 (dynamic hardness in consideration of plastic deformation) of 40 or more is selected as the resin substrate, an organic film or a metal film having hardness DHv2 less than 40 is patterned on a part where the element is to be formed in the surface of the resin substrate, and then, an aerosol of brittle material fine particles is allowed to collide with the substrate surface containing the organic film or the metal film, and the brittle material fine particles are deformed or crushed due to the impact by the collision so that the fine particles are rebounded, and thus, a brittle material structure is formed only on the organic film surface or the metal film surface within the substrate surface.

Japanese Patent Application Publication JP-P2005-317952A discloses a method of manufacturing a piezoelectric actuator having a piezoelectric material layer formed by spraying a carrier gas containing fine particles of a piezoelectric material on a substrate surface to deposit the fine particles thereon, and the method is for easily forming the piezoelectric material layer on a partial region of the substrate surface. In the method of manufacturing a piezoelectric actuator, a film formation permitting region where fine particles of a piezoelectric material in a carrier gas are deposited to form a film on the substrate surface in advance and a film formation inhibiting region where the deposition of fine particles in the form of a film are inhibited are provided, then, the carrier gas containing the fine particles is sprayed on the substrate surface, and thus, the piezoelectric material layer is formed on the film formation permitting region. Further, in JP-P2005-317952A, the film formation permitting region and the film formation inhibiting region are distinguished by differing hardness, and the ratio between the hardness of the powder and the hardness of the respective regions are disclosed.

Figure 14:
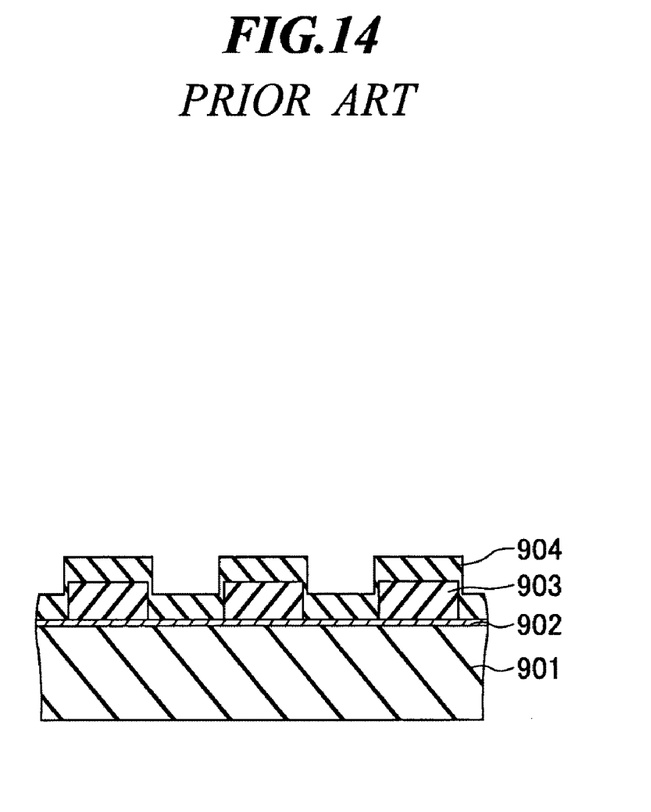
FIG. 14 is a sectional view for explanation of a conventional method of manufacturing a patterned film by using the AD method.

By the way, in the case where a patterned film is formed by using the AD method as shown in FIG. 14, a resist mask 903 is formed on a substrate 901 on which an electrode 902 has been formed, a film 904 is formed by spraying an aerosol toward the substrate thereon, and then, the resist mask is removed by wet etching. For example, in the method of forming a piezoelectric actuator disclosed in JP-P2003-142750A, such a method is used. However, when the film is formed by the AD method, the film is formed by the deposition of the raw material powder not only on the opening of the resist pattern but also on the side surface thereof. As a result, in the step of removing the resist, a separation liquid can hardly enters to the resist and the separation of the resist becomes difficult, and thus, the formed patterned film may be damaged.

On the other hand, in JP-P2004-91854A, JP-P2004-146750A, and JP-P2005-317952A, the film formation is selectively performed by partially changing the hardness of the under layer to provide the region (mask part) where the raw material powder can hardly be deposited when the aerosol is sprayed thereon. In this case, the defects that the film is deformed when the mask is removed, that the mask can hardly be removed, and so on are avoidable. However, when the film formation is performed by the AD method, the edge of the mask is scraped and deformed due to the blast effect by the sprayed powder, and the accuracy of the formed film may be reduced.

Furthermore, in JP-P2004-91854A, the mask is formed by attaching a plastic base material, in which an opening has been formed, to a substrate, and thus, it is difficult to cover the microfabrication and high definition of elements.

SUMMARY OF THE INVENTION

The present invention has been achieved in view of the above-mentioned problems. An object of the present invention is to form an accurately patterned film when film formation is performed by using the AD method.

In order to achieve the above-mentioned object, a method of manufacturing a patterned film according to a first aspect of the present invention includes the steps of: (a) disposing a multilayered mask containing at least one soft mask layer formed of a soft material and at least one hard mask layer formed of a hard material on one of a substrate and an electrode formed on the substrate; (b) spraying powder formed of a brittle material toward the substrate, on which the multilayered mask has been disposed, and allowing the powder to collide with an under layer to deposit the powder thereon, thereby forming a brittle material layer; and (c) removing the multilayered mask after step (b).

Further, a method of manufacturing a patterned film according to a second aspect of the present invention includes the steps of: (a) disposing a mask having projection on one of a substrate and an electrode formed on the substrate; (b) spraying powder formed of a brittle material toward the substrate, on which the mask has been disposed, and allowing the powder to collide with an under layer to deposit the powder thereon, thereby forming a brittle material layer; and (c) removing the mask after step (b).

According to the present invention, since the attachment of the film to the entire side surfaces of the mask can be avoided by stacking plural layers to make the mask higher or providing projection on the mask, the separation liquid can be allowed to sufficiently permeate the mask at the step of removing the mask. Therefore, the mask can be smoothly removed without damaging the film, and the accurate patterned film having sharp outlines can be formed.

DESCRIPTION OF THE PREFERRED EMBODIMENTS

Hereinafter, preferred embodiments of the present invention will be explained in detail by referring to the drawings. The same component elements are assigned with the same reference numerals and the descriptions thereof will be omitted.

Figure 1:
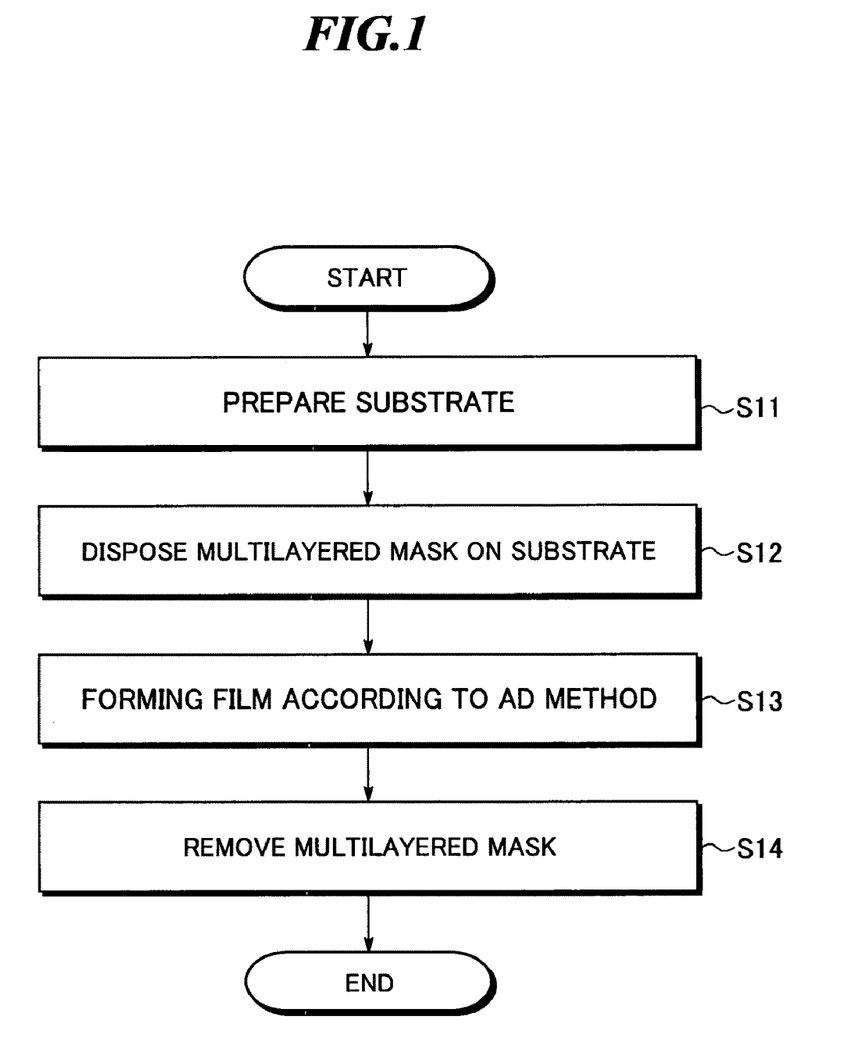
FIG. 1 is a flowchart showing a method of manufacturing a patterned film according to the first embodiment of the present invention.

FIG. 1 is a flowchart showing a method of manufacturing a patterned film according to the first embodiment of the present invention. Further, FIGS. 2A-2D and FIGS. 4A and 4B are sectional views for explanation of the method of manufacturing a patterned film according to the embodiment, and FIG. 3 is a schematic view showing a film forming apparatus by using the aerosol deposition method according to the first embodiment of the present invention.

Figure 2A:
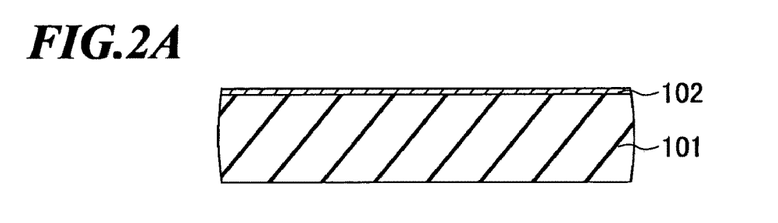
FIGS. 2A-2D are sectional views for explanation of the method of manufacturing a patterned film according to the first embodiment of the present invention.
Figure 3:
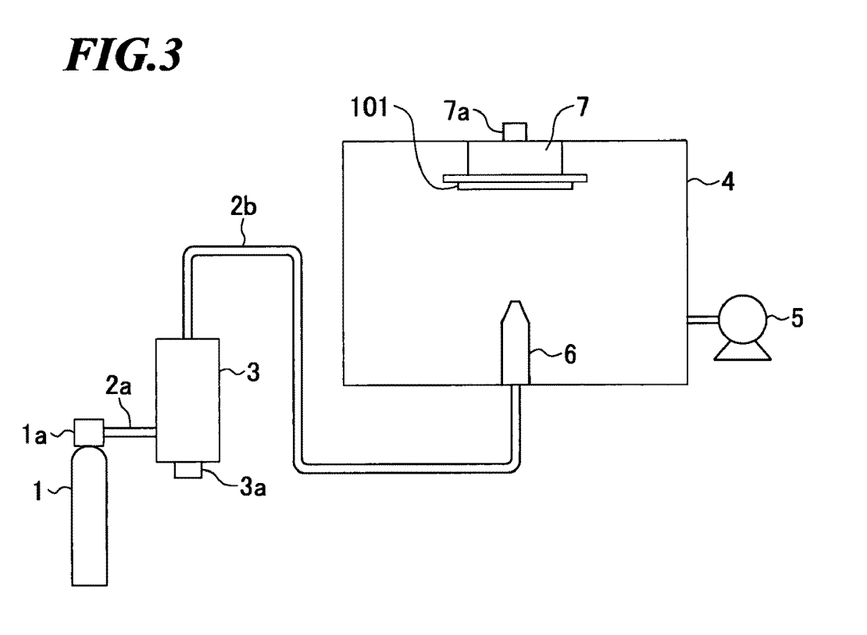
FIG. 3 is a schematic view showing a configuration of a film forming apparatus according to the aerosol deposition (AD) method.

First, at step S11 in FIG. 1, a substrate 101, on which a patterned film is to be formed, is prepared as shown in FIG. 2A. As a substrate material, a suitable material is selected according to a device to which the patterned film is applied. For example, in the case where a piezoelectric actuator is manufactured by forming a patterned film of a piezoelectric material, a silicon (Si) substrate, zirconia ($ZrO_2$) substrate, SUS (stainless steel) substrate, or the like is used. Further, according to the use of the patterned film, an electrode layer 102 may be formed on the substrate 101.

Then, at step S12, a multilayered mask containing a mask layer of a soft material (a soft mask layer) and a mask layer of a hard material (a hard mask layer) is disposed on the substrate 101 or the electrode layer 102 formed according to need. In this application, the soft material refers to a material that is soft and has elasticity to some degree (e.g., a material having Young's modulus of one digit to about 50 $kgf/mm^2$). Specifically, a normal resist, dry film resist, urethane, adhesive, or the like applies. On the other hand, the hard material refers to a material that is hard and has low elasticity (e.g., a material having Young's modulus on the order of $10^4$ $kgf/mm^2$ or more). Specifically, a metal such as SUS (stainless steel), copper (Cu), iron (Fe), nickel (Ni), tungsten (W), or molybdenum (Mo), an alloy of those metals, ceramics, or the like applies. In the embodiment, a resist is used as the soft material and a metal is used as the hard material.

Figure 2B:
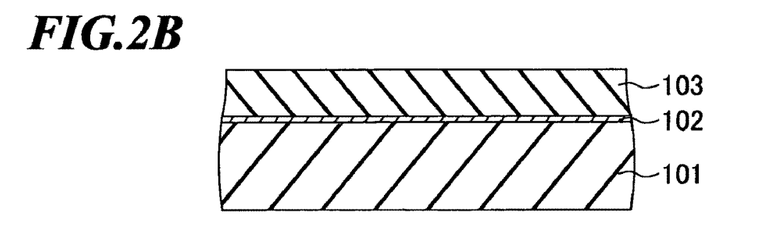

In order to form such a multilayered mask, first, as shown in FIG. 2B, a resist layer 103 is formed by applying a resist onto the electrode layer 102 using spin coating or the like. It is desirable that the thickness of the resist layer 103 is determined according to the thickness of the patterned film formed by the AD method. Usually, it is desirable that the thickness of the resist layer 103 is about twice or more the thickness of the patterned film. When the thickness of the patterned film is made as large as 10 μm or more, the thickness of the resist layer 103 is desirably as large as 50 μm to 100 μm. In the case where such a thick resist layer is disposed, a dry film resist may be used.

Figure 2C:
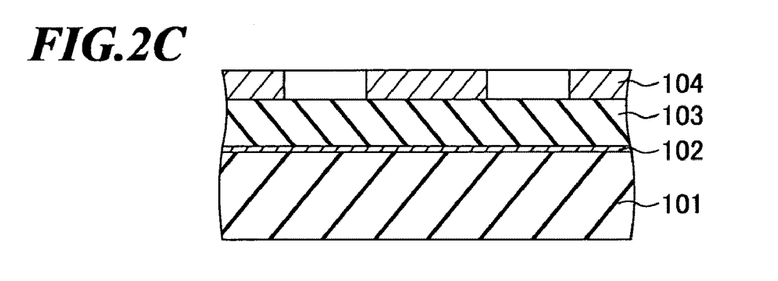
Figure 2D:
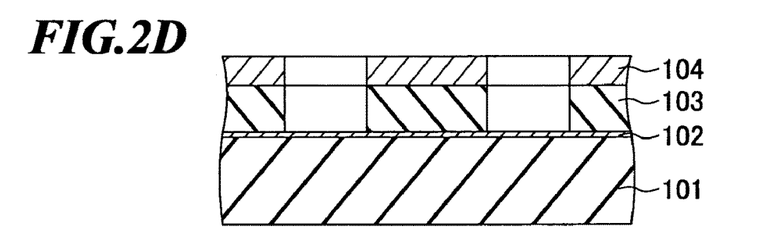

Then, as shown in FIG. 2C, a metal mask 104 having a desired opening formed is bonded onto the resist layer 103. Then, the resist layer 103 is exposed to light and deposited, and thereby, the multilayered mask containing the resist layer 103 and the metal mask 104 is formed as shown in FIG. 2D.

Then, at step S13 in FIG. 1, a film is formed by using the AD method on the electrode layer 102 on which the multi-layered mask has been disposed. In the embodiment, a brittle material film is formed by using powder of a brittle material such as ceramics as a raw material. For example, in the case where a piezoelectric film is formed, powder of a piezoelectric material of PZT (Pb (lead) zirconate titanate) or the like is used.

FIG. 3 is a schematic diagram showing a film forming apparatus according to the AD method. As shown in FIG. 3, the film forming apparatus includes a compressed gas cylinder 1, carrier pipes 2a and 2b, an aerosol generating chamber 3, a film forming chamber 4, an exhaust pump 5, an injection nozzle 6, and a substrate holder 7.

The compressed gas cylinder 1 is filled with nitrogen ($N_2$), oxygen ($O_2$), helium (He), argon (Ar), dry air or the like to be used as a carrier gas. Further, in the compressed gas cylinder 1, a pressure regulation part 1a for regulating the supplied amount of the carrier gas is provided.

The aerosol generating chamber 3 is a container in which raw material powder is placed. The raw material powder placed therein is blown up and dispersed by introducing the carrier gas from the compressed gas cylinder 1 via the carrier pipe 2a into the aerosol generating chamber 3. Thus generated aerosol is supplied to the injection nozzle 6 via the carrier pipe 2b. Further, the aerosol generating chamber 3 is provided with a container driving part 3a for agitating the raw material powder placed in the aerosol generating chamber 3 by providing vibration or the like to the aerosol generating chamber 3.

The exhaust pump 5 exhausts the air within the film forming chamber 4 and holds a predetermined degree of vacuum.

The injection nozzle 6 has an opening having a predetermined shape and size (e.g., the long side is about 5 mm and the short side is about 0.5 mm) and injects the aerosol supplied from the aerosol generating chamber 3 toward the substrate 101 at a high speed. Thereby, the aerosolized raw material powder collides with the under layer, that is, the substrate or the layer that has been formed on the substrate and is crushed. At that time, the crushed faces formed on the raw material powder adhere to the under layer, and thus, the film is formed. Such film formation mechanism is called mechanochemical reaction.

The substrate holder 7 holds the substrate 101. Further, in the substrate holder 7, a substrate holder driving part 7a for moving the substrate holder 7 in a three-dimensional manner is provided. The relative position and the relative speed between the injection nozzle 6 and the substrate 101 are adjusted by controlling the movement of the substrate holder driving part 7a.

Figure 4A:
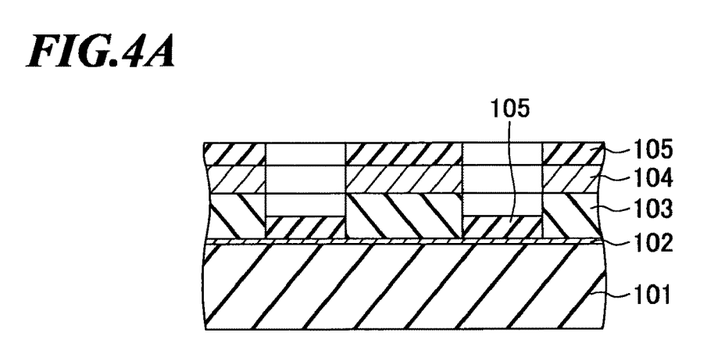
FIGS. 4A and 4B are sectional views for explanation of the method of manufacturing a patterned film according to the first embodiment of the present invention.

In the above-mentioned film forming apparatus, the raw material powder is placed in the aerosol generating chamber 3 and the substrate 101 is set in the substrate holder 7 and kept at an appropriate temperature. The substrate temperature is set at a temperature at which the material constituting the multilayered mask can bear. For example, in the case of using an organic material including a resist as in the embodiment, the temperature is set lower than the contraction start temperature and dissolution temperature of the organic material (e.g., about 300° C. for polyimide). Then, by the operation of the film forming apparatus, a film 105 is formed on the substrate 101 or the electrode layer 102 as shown in FIG. 4A.

In the film forming apparatus, the mechanism of generating the aerosol is not limited to the configuration shown in FIG. 3. That is, various configurations may be used as long as the state in which the raw material powder is dispersed in a gas can be generated. For example, instead of the configuration of introducing the gas into the container containing the raw material powder, a configuration of taking out a predetermined amount of the raw material powder from the container and aerosolizing the taken out raw material powder may be used. Specifically, there is a configuration including the container for the raw material powder, a raw material powder supply unit (powder supply disk) that rotationally moves to continuously receive the supply of the raw material powder at a predetermined rate (supply speed) from the container and transport the raw material powder, and an aerosol generating unit (aerosolizing unit) that generates an aerosol by dispersing the raw material powder transported by the raw material powder supply unit with a gas. In such a configuration, a stable amount of the raw material powder can be supplied by forming grooves with predetermined widths, into which the raw material powder is introduced, in the raw material powder supply unit, and the supplied amount of the raw material powder can be controlled by adjusting the speed of rotational driving of the raw material powder supply unit. Then, by introducing the carrier gas into the grooves in the location where the raw material powder has been transported, an aerosol with stable concentration can be generated.

Further, there is another configuration for agitating the raw material powder in the container of the raw material powder, introducing the compressed gas into the container, taking out a predetermined amount of the raw material powder mixed with the compressed gas, and exhausting them from a hole having a small diameter to disperse the raw material powder by utilizing the expansion of a compressed gas. Furthermore, a configuration for generating an aerosol by continuously supplying the raw material powder to the channel of the carrier gas to disperse the raw material powder in the carrier gas may be used.

Figure 4B:
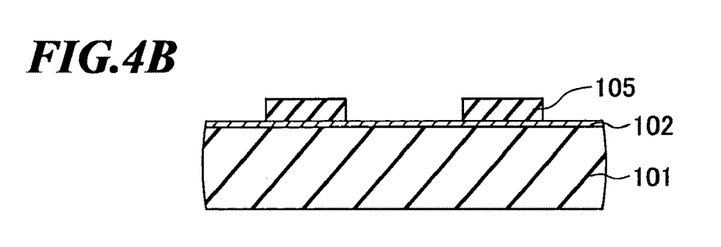

Referring to FIG. 1 again, at step S14, the resist layer 103 is separated by wet etching. Thereby, the entire multilayered mask is removed and the film 105 formed in a desired pattern on the electrode layer 102 is obtained as shown in FIG. 4B.

In the embodiment, advantages for using the multilayered mask having the resist layer 103 as the soft material and the metal mask as the hard material stacked are as follows. That is, when the film formation according to the AD method is performed, the raw material powder also collides with the mask. However, scraping and deformation of the mask can be prevented by providing the hard mask layer on the surface (as the uppermost layer) of the mask. Further, since the stress generated when the raw material powder collides with the hard mask layer is absorbed by providing the soft mask layer within the multilayered mask, the deformation of the mask can be suppressed. Therefore, the shape of the mask can be maintained even when the film formation is performed over a long time, and high-definition patterning can be realized.

Further, since the height of the entire mask becomes higher by stacking plural material layers, the film coating on the mask side surface, that has been problematic when a single layer resist mask is used, is reduced. Accordingly, at the step of separating the mask (step S14 in FIG. 1), the separation liquid can easily permeate the resist. Consequently, the resist can be smoothly separated without damaging the formed film.

In the embodiment, as has been described by referring to FIGS. 2A-2D, the metal mask used when the resist layer 103 is exposed to light is also used as the metal mask as a part of the multilayered mask. However, separate masks may be used respectively. In this case, after the metal mask is disposed on the resist layer 103 and exposed to light, the metal mask is once removed and the resist layer is developed, and then, a metal mask on which the same pattern as the resist pattern has been formed is aligned and bonded onto the resist pattern.

Next, application examples of the multilayered mask to be used in the method of manufacturing a patterned film according to the first embodiment of the present invention will be explained by referring to FIGS. 5 and 6.

Figure 5:
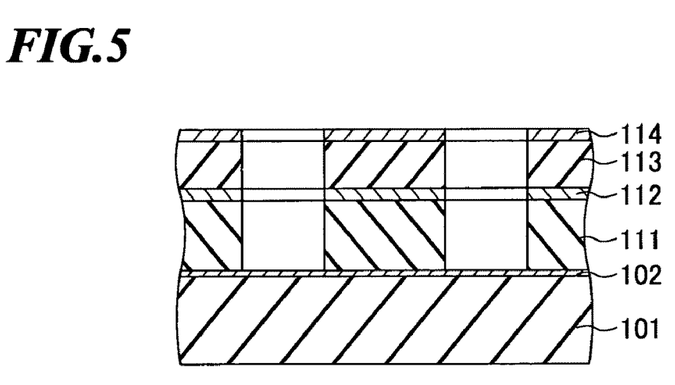
FIG. 5 is a sectional view showing the first application example of a multilayered mask to be used in the method of manufacturing a patterned film according to the first embodiment of the present invention.

FIG. 5 is a sectional view showing the first application example of the multilayered mask. The multilayered mask includes plural soft mask layers 111 and 113 formed of a soft material such as a resist, and plural hard mask layers 112 and 114 formed of a hard material such as a metal. These soft mask layers 111 and 113 and the hard mask layers 112 and 114 are alternately stacked, and the uppermost layer is the hard mask layer 114.

Figure 6:
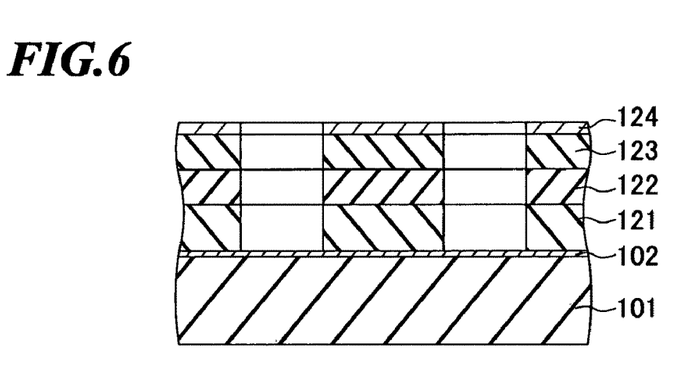
FIG. 6 is a sectional view showing the second application example of the multilayered mask to be used in the method of manufacturing a patterned film according to the first embodiment of the present invention.

Further, FIG. 6 is a sectional view showing the second application example of the multilayered mask. The multilayered mask includes plural soft mask layers 121-123 formed of soft materials such as a resist, and an uppermost hard mask layer 124 formed of a hard material such as a metal. The materials of the plural soft mask layers 121-123 may be the same or different from one another.

As shown in FIGS. 5 and 6, the film coating over the mask side surface at the film formation (step S13) is further reduced by increasing the number of layers stacked in the multilayered mask, and thus, the multilayered mask can be removed more easily at the separating step (step S14). As long as the uppermost layer is formed of a hard material, a hard material layer may be inserted into the intermediate part (see FIG. 5) or not (see FIG. 6).

Figure 7:
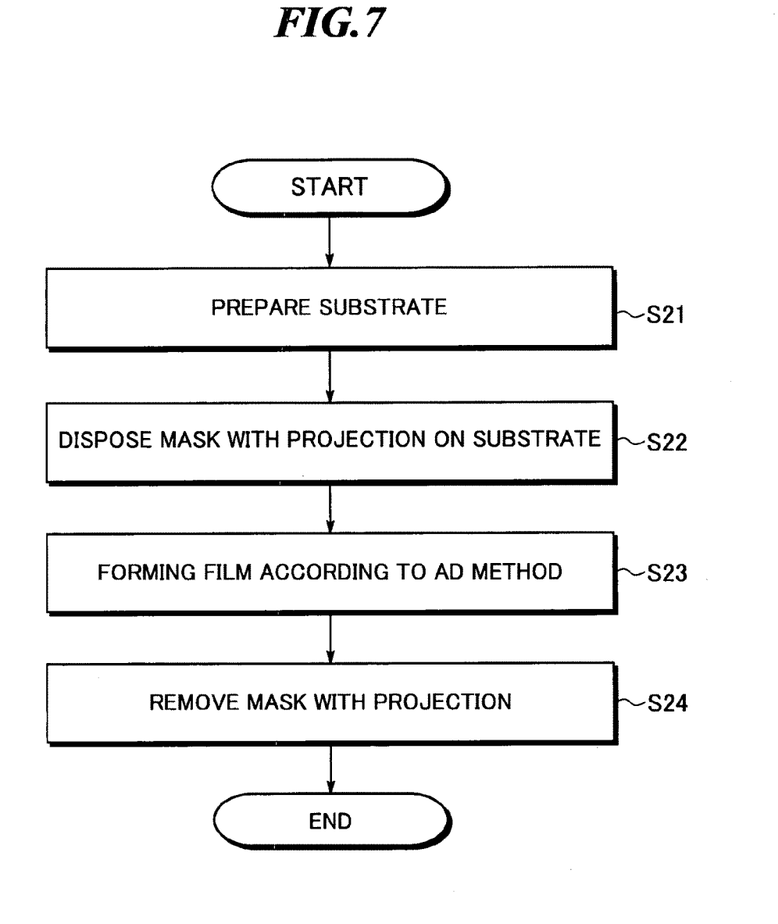
FIG. 7 is a flowchart showing a method of manufacturing a patterned film according to the second embodiment of the present invention.

Next, a method of manufacturing a patterned film according to the second embodiment of the present invention will be explained. FIG. 7 is a flowchart showing the method of manufacturing a patterned film according to the embodiment. Further, FIGS. 8A-8G are sectional views for explanation of the method of manufacturing a patterned film according to the embodiment.

Figure 8A:
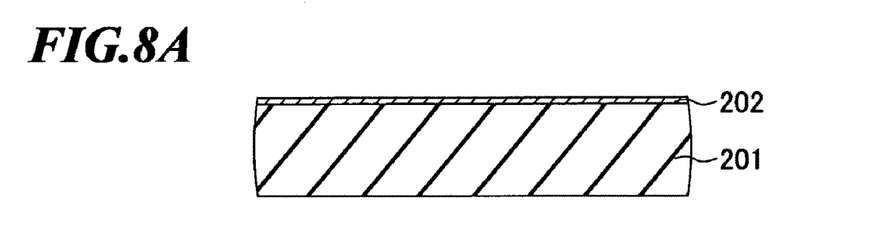
FIGS. 8A-8G are sectional views for explanation of the method of manufacturing a patterned film according to the second embodiment of the present invention.

First, at step S21 in FIG. 7, a substrate 201 on which a patterned film is to be formed is prepared as shown in FIG. 8A. As a substrate material, an appropriate material is selected according to a device to which the patterned film is applied as that in the first embodiment. Further, an electrode layer 202 maybe formed on the substrate 201 according to need.

Figure 8B:
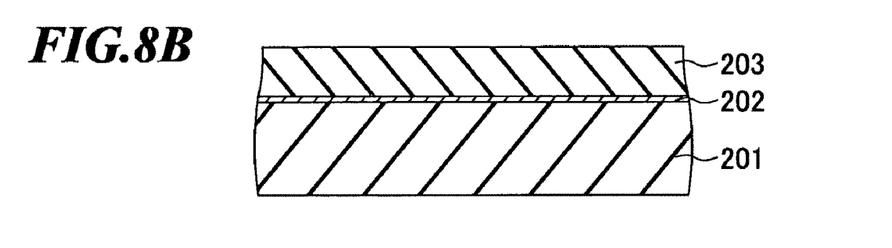

Then, at step S22, a mask with projection is disposed on the substrate 201 or the electrode layer 202 formed according to need. For the purpose, first, as shown in FIG. 8B, a resist layer 203 is formed by applying a resist onto the electrode layer 202 by using spin coating or the like. It is desirable that the thickness of the resist is determined according to the thickness of the patterned film formed by the AD method. Usually, it is desirable that the thickness of the resist layer 203 is about twice or more the thickness of the patterned film. When the thickness of the patterned film is made as large as 10 μm or more, the thickness of the resist layer 203 is desirably as large as 50 μm to 100 μm. In the case where such a thick resist layer is disposed, a dry film resist may be used.

Figure 8C:
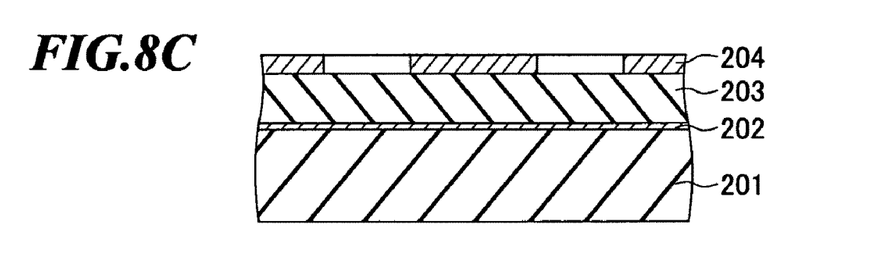
Figure 8D:
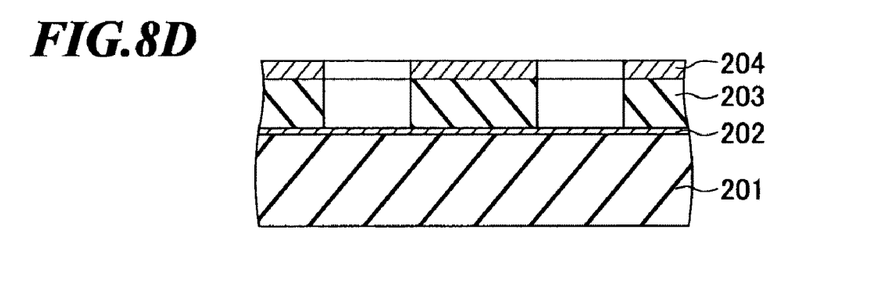
Figure 8E:
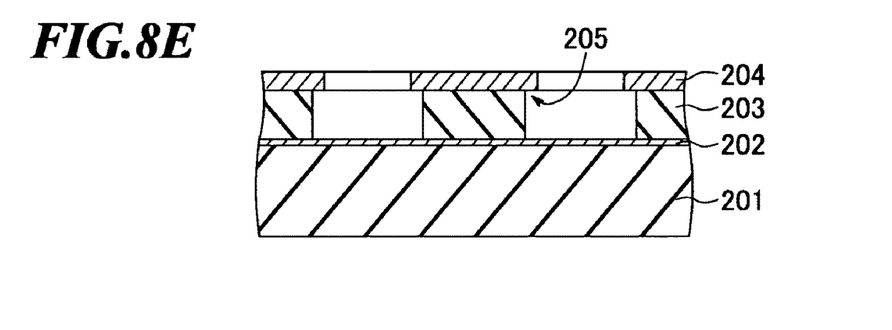

Then, as shown in FIG. 8C, a metal mask 204 having a desired opening formed is bonded onto the resist layer 203, and the resist layer 203 is exposed to light and developed. Thereby, the multilayered mask containing the resist layer 203 and the metal mask 204 is formed as shown in FIG. 8D. Furthermore, the side surface of the resist layer 203 is selectively etched by wet etching the multilayered mask. Thereby, the mask having the metal mask 204 with ends of openings as projections 205 is formed.

Figure 8F:
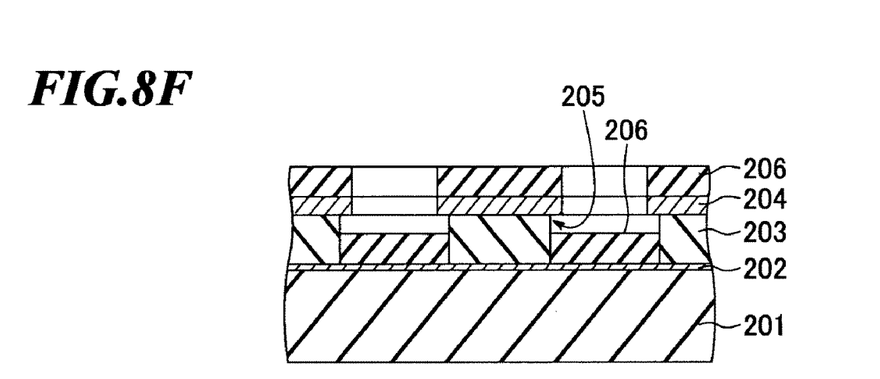

Then, at step S23 in FIG. 7, a film is formed by using the AD method on the electrode layer 202 on which the mask with projection has been disposed as shown in FIG. 8F. The film forming apparatus and the film forming condition used at the step are the same as those explained in the first embodiment.

Figure 8G:
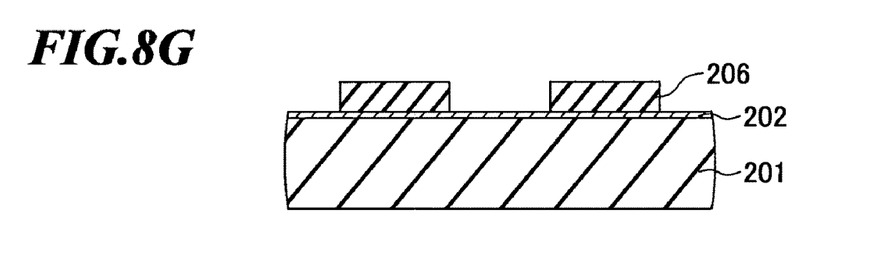

Then, at step S24, the resist layer 203 is separated by wet etching. Thereby, the entire mask with projection is removed and the film 206 formed in a desired pattern on the electrode layer 202 is obtained as shown in FIG. 8G.

Advantages for using the mask with projection in the embodiment are as follows. That is, when the film formation according to the AD method is performed, the film is not deposited at least on the parts of the side surfaces of the mask shaded by the projections. Accordingly, at the step of separating the mask (step S24 in FIG. 7), the separation liquid can easily permeate the resist layer 203. Consequently, the resist can be smoothly separated without damaging the formed film.

Generally, since the powder injected from the injection nozzle 6 (FIG. 3) becomes broader toward the end, the film is formed to the edge of the mask in the lower part apart from the projection of the mask with projection. Therefore, a patterned mask accurately reflecting the mask shape can be formed.

Further, in the embodiment, since the mask with projection is formed by stacking the soft material (the resist layer 203) and the hard material (the metal mask 204), the mask is difficult to be scraped when the powder is sprayed to the mask at the time of film formation and capable of absorbing the impact of the powder. Therefore, the shape of the mask can be maintained over a long time, and high-definition patterning can be realized.

In the second embodiment, the mask with projection has been fabricated by using the resist and metal mask. However, the usable materials are not limited to the combination, and various materials may be used as is the case in the first embodiment.

Next, application examples of the mask with projection to be used in the method of manufacturing a patterned film according to the second embodiment of the present invention will be explained by referring to FIGS. 9A-11.

Figure 9A:
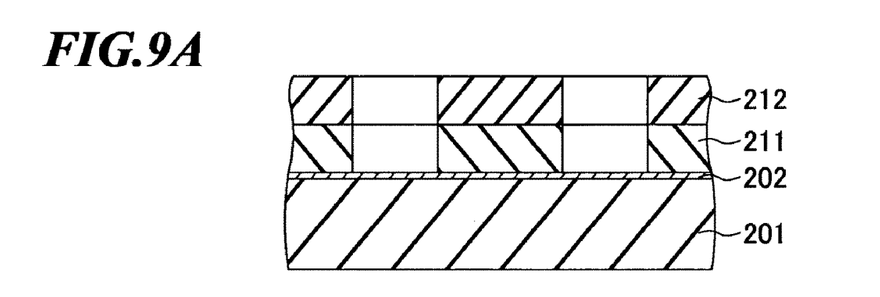
FIGS. 9A and 9B are sectional views for explanation of the first application example of a mask with projection to be used in the method of manufacturing a patterned film according to the second embodiment of the present invention.
Figure 9B:
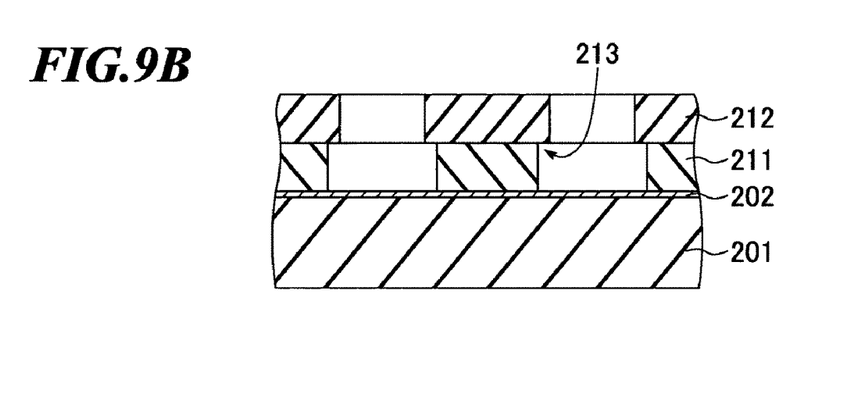

FIGS. 9A and 9B are sectional views for explanation of the first application example of the mask with projection.

First, as shown in FIG. 9A, a first mask layer 211 is formed of a material to be etched with a predetermined separation liquid on the substrate 201 (or the electrode layer 202). Then, a second mask layer 212 is formed of a material not to be etched with the separation liquid or a material with a lower etching rate to the separation liquid than that of the material of the first mask layer. Furthermore, regarding the multilayered mask, the side surfaces of the first mask layer 211 are etched by using the separation liquid. Thereby, projections 213 shown in FIG. 9B are formed.

Thus, the materials of the mask with projection are not limited to the combination of a resist and a metal. As long as materials are different in etching rate to a predetermined separation liquid, they may be used in combination. In this case, the material with lower etching rate is disposed as the surface layer. As specific combinations, there are a combination of photoresist AZ5214 manufactured by Clariant (Japan) K.K. and non-photosensitive polyimide PIX-1400 manufactured by HD MicroSystems, Ltd., a combination of PIX-1400 and dry film resist (DFR) BF410, BF405, BF45Z manufactured by TOKYO OHKA KOGYO CO., LTD., and so on.

Further, there is a method of making a mask with projection by using no separation liquid. For example, in FIG. 9A, the first mask layer 211 is formed by employing a first material that dissolves at a first temperature, and the second mask layer 212 is formed by employing a second material that dissolves at a second temperature higher than the first temperature. Then, the multilayered mask is heated at a temperature from the first temperature to less than the second temperature so that the side surfaces of the first mask layer 211 are dissolved. Thereby, the projections 213 shown in FIG. 9B are formed. Specifically, in the case where the PIX-1400 is used as the first material and the DFR (BF410 or the like) is used as the second material, the projections are formed by heating at about 300° C. Alternatively, a resin material such as the AZ5214, PIX-1400, or the DFR (BF410 or the like) may be used as the first material and a hard material such as a metal may be used as the second material.

On the other hand, in FIG. 9A, the first mask layer 211 is formed using the first material (e.g., an organic material) that contracts by heating, and the second mask layer 212 is formed using a second material that does not contract by heating, a second material that has a higher coefficient of thermal contraction than that of the first material, or a second material that has a higher contraction start temperature than that of the first material. Then, the projections 213 may be formed by heating the multilayered mask at a temperature not lower than the contraction start temperature of the first material (more preferably, the temperature lower than the contraction start temperature of the second material) so that the side surfaces of the first mask layer 211 contract. Specifically, in the case where the DFR (BF410 or the like) is used as the first material and SUS is used as the second material, the projections are formed by heating at about 150° C.-300° C. (the upper limit is about 300° C.). Alternatively, a resin material such as the AZ5214, PIX-1400, or the DFR (BF410 or the like) may be used as the first material and a hard material such as a metal may be used as the second material.

In addition, a mask with projection may be fabricated by using combinations of various methods and materials as long as it is possible that at least part of the side surface of the first mask layer is removed so that the diameter or width thereof is made smaller than that of the second mask layer. Although the material disposed on the uppermost layer is not limited to a metal, a hard material is desirable for suppressing the blast (scraping) by the powder sprayed at the time of film formation.

Figure 10A:
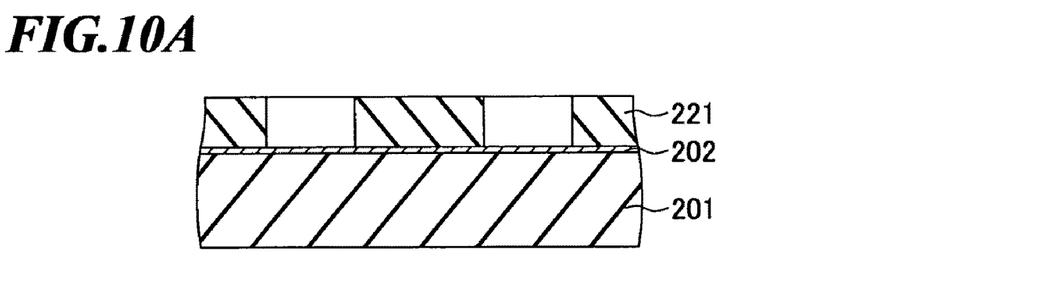
FIGS. 10A and 10B are sectional views for explanation of the second application example of the mask with projection to be used in the method of manufacturing a patterned film according to the second embodiment of the present invention.
Figure 10B:
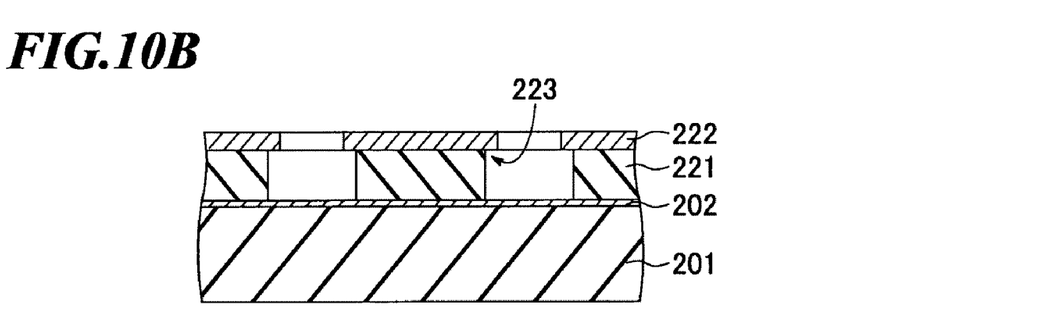

FIGS. 10A and 10B are sectional views for explanation of the second application example of the mask with projection. First, as shown in FIG. 10A, a first mask layer 221 is formed on the electrode layer 202, and an opening is formed in the electrode layer 202. Then, a second mask layer (e.g., metal mask) 222, in which an opening has been previously formed, is aligned and bonded onto the first mask layer. The opening of the second mask layer is designed to be slightly smaller than the patterned film to be formed. Thereby, the edge of the second mask is slightly protrudes into an opening formed in the first mask 221. The protruding part is a projection 223 shown in FIG. 10B.

In the case where the mask with projection is formed according to the method, it is unnecessary to consider the etching rate or the like when the materials of the first and second mask layers are selected. As the materials of the first and second mask layers, a combination of a soft material such as a resist and a hard material such as a metal may be used, another combination may be used, or the same material may be used.

Figure 11:
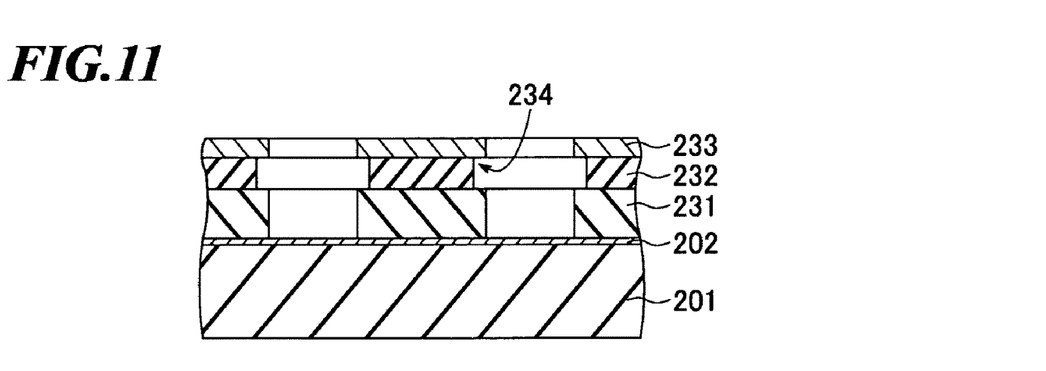
FIG. 11 is a sectional view for explanation of the third application example of the mask with projection to be used in the method of manufacturing a patterned film according to the second embodiment of the present invention.

FIG. 11 is a sectional view for explanation of the third application example of the mask with projection. The mask with projection contains a first mask layer 231, a second mask layer 232, and a third mask layer 233. Thus, in the mask with projection according to the embodiment, three or more mask layers may be stacked. In this case, the mask layer shaded by a projection 234 may not be necessarily the lowermost layer, but a layer that allows the separation liquid to permeate the lowermost layer (the first mask layer 231) via the intermediate layer (the second mask layer 232).

Such a mask with projection may be formed by stacking the first to third mask layers 231-233 of materials different in etching rate from one another, and then, preferentially etching the second mask layer 232 and sequentially aligning and bonding the mask layers in which openings having different sizes from one another on the substrate. Further, as the materials of the first to third mask layers 231-233, a combination of a soft material such as a resist and a hard material such as a metal may be used, a combination of plural kinds of soft materials or hard materials may be used, or the same material may be used in the plural layers. It is desirable that a hard material is disposed on the uppermost layer for suppressing the blast at the time of film formation, and further, a hard material layer may be provided in the intermediate layer.

Figure 12:
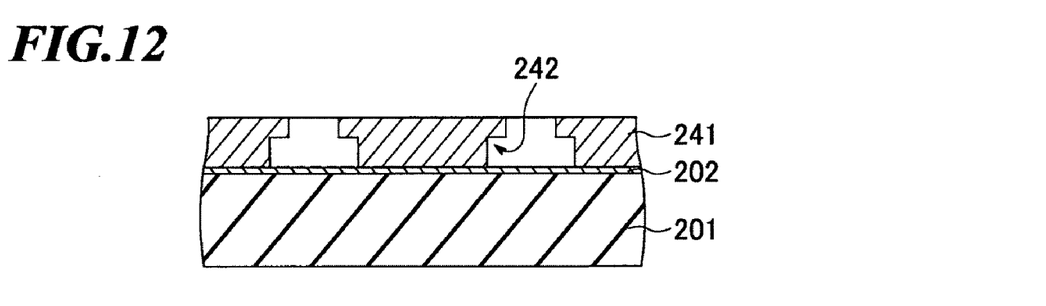
FIG. 12 is a sectional view for explanation of the fourth application example of the mask with projection to be used in the method of manufacturing a patterned film according to the second embodiment of the present invention.

FIG. 12 is a sectional view for explanation of the fourth application example of the mask with projection. In the application example, a metal mask 241 itself has a shape with projection. Thus, in the embodiment, the mask is not necessarily configured by plural members, but any structure may be used as long as projections 242 can be provided. For example, an integrated metal mask with projection may be fabricated by forming an opening having steps in a metal plate.

As a working example, an electrode layer is formed by forming a film of titanium oxide ($TiO_2$) having a thickness of about 50 nm and a film of platinum (Pt) having a thickness of about 500 nm on a silicon substrate. A resist (non-photosensitive polyimide PIX-1400 manufactured by HD MicroSystems, Ltd.) is applied thereon by using spin coating in thickness of about 2 μm. It is dried and then exposed to light and developed for patterning, and thus, a resist layer is formed. Then, a metal mask (SUS304) in which almost the same pattern as the pattern of the resist layer is formed is bonded on the resist layer, and thus, a multilayered mask is formed. Further, the multilayered mask is soaked in a separation liquid (developer liquid AZ300MIF manufactured by Clariant, TMAH (tetrametylammonium hydroxide) 2.38%) diluted to about one-tenth of the usual concentration, for about thirty seconds, and thus, the side surfaces of the resist layer are etched. Thereby, the mask with projection is formed.

Next, film formation is performed by using the AD method on the substrate having the mask with projection disposed thereon. As raw material powder, PZT (Pb (lead) zirconate titanate) manufactured by SAKAI CHEMICAL INDUSTRY CO., LTD. and PNN-PZT (50PNN-15PZ-35PT) manufactured by Furuuchi Chemical Corporation are used. Further, as film forming conditions, the substrate temperature is set to room temperature, the pressure within the film forming chamber (FIG. 3) is set to 40 Pa, and the pressure within the aerosol generating chamber (FIG. 3) is set to 50 kPa.

Then, thus formed film is soaked together with the substrate in the separation liquid (developer liquid AZ300MIF manufactured by Clariant), and thereby, the mask with projection is removed. Consequently, a patterned film formed on the electrode layer is obtained.

On the other hand, as a comparative example, a single layer mask of a resist layer only is provided on the substrate having the electrode formed thereon, and the film formation according to the AD method and removal of the mask are performed in the similar manner as in the working example.

Figure 13A:
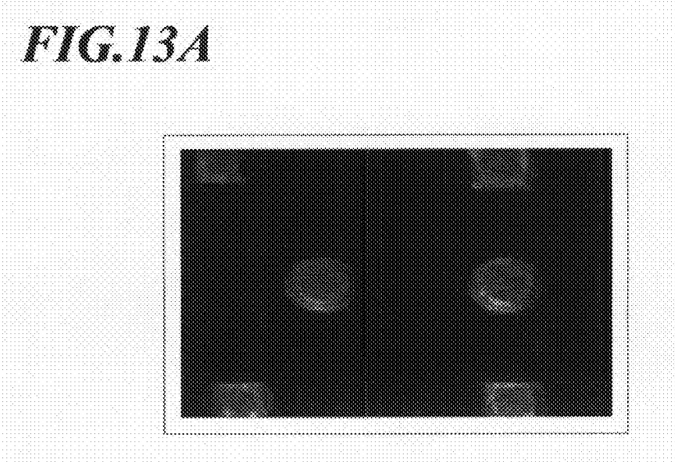
FIGS. 13A and 13B are a photograph showing a patterned film manufactured by using the mask with projection and a photograph showing a patterned film manufactured by using a single-layer mask for comparison.
Figure 13B:
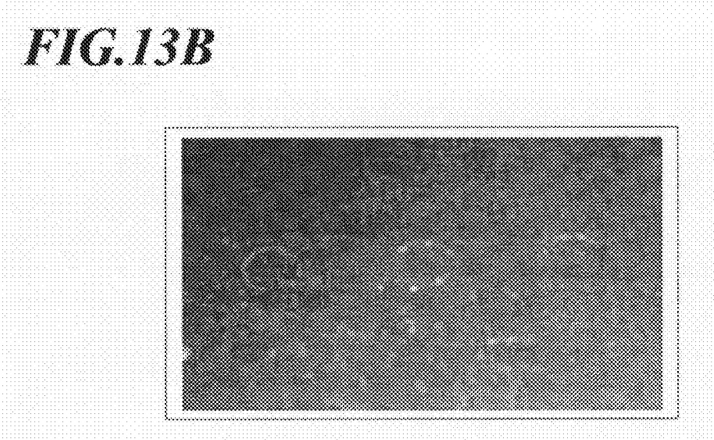

FIG. 13A is a photograph showing the patterned film fabricated in the working example. As clearly found from FIG. 13A, when the mask with projection is used, the mask can be smoothly removed and the patterned film with sharp outlines can be obtained. On the other hand, FIG. 13B is a photograph showing the patterned film fabricated as the comparative example. When only the single-layer resist mask is used, the separation liquid can hardly permeate to the resist layer, and the resist layer can not be removed.

Using the above-explained methods of manufacturing a patterned film according to the first or second embodiment of the present invention, minute patterns can be accurately formed, and the function of devices applied with the patterned film may be improved. For example, in the case where a pattern of piezoelectric film of PZT or the like is employed as a piezoelectric actuator to be used in an inkjet head, the high-definition pattern enables improvement in the image quality of images to be printed out. Alternatively, in the case where the pattern of piezoelectric film is employed as an ultrasonic transducer array for ultrasonic diagnostic apparatus, the high-definition pattern enables high-accuracy control of the transmission and reception directions and reception depths of ultrasonic beams, and thereby, high-quality ultrasonic images can be generated.

The invention claimed is:

1. A method of manufacturing a patterned film comprising the steps of:
   (a) disposing a multilayered mask containing at least one soft mask layer formed of a soft material and at least one hard mask layer formed of a hard material on one of a substrate and an electrode formed on said substrate;
   (b) spraying powder formed of a brittle material toward said substrate, on which said multilayered mask has been disposed, and allowing the powder to collide with an under layer to deposit the powder thereon, thereby forming a brittle material layer; and
   (c) removing said multilayered mask after step (b).

2. The method according to claim 1, wherein said multilayered mask contains a hard mask layer as an uppermost layer.

3. The method according to claim 1, wherein said multilayered mask contains soft mask layers and hard mask layers which are alternately stacked.

4. The method according to claim 1, wherein the soft material includes an organic material.

5. The method according to claim 4, wherein the soft material includes a resist.

6. The method according to claim 1, wherein the hard material includes a metal.

7. A method of manufacturing a patterned film comprising the steps of:
   (a) disposing a mask having projection on one of a substrate and an electrode formed on said substrate;
   (b) spraying powder formed of a brittle material toward said substrate, on which said mask has been disposed, and allowing the powder to collide with an under layer to deposit the powder thereon, thereby forming a brittle material layer; and
   (c) removing said mask after step (b).

8. The method according to claim 7, wherein said mask contains at least two mask layers in which patterns having different sizes are formed respectively.

9. The method according to claim 7, wherein step (a) includes the steps of:

(a1) forming a first mask layer on one of said substrate and said electrode formed on said substrate; and
   (a2) disposing a second mask layer on the first mask layer such that an edge of an opening formed in the second mask layer protrudes into an opening formed in the first mask layer.

10. The method according to claim 7, wherein step (a) includes the steps of:
    (a1) forming a first mask layer on one of said substrate and said electrode formed on said substrate;
    (a2) forming a second mask layer on the first mask layer; and
    (a3) removing at least a part of a side surface of the first mask layer to form a projection of the second mask layer.

11. The method according to claim 10, wherein:
    step (a1) includes forming the first mask layer by employing a first material to be etched with a predetermined separation liquid;
    step (a2) includes forming the second mask layer by employing a second material having a lower etching rate to the predetermined separation liquid than the first material; and
    step (a3) includes etching the side surface of the first mask layer by using the separation liquid.

12. The method according to claim 10, wherein:
    step (a1) includes forming the first mask layer by employing a material which dissolves at a first temperature;
    step (a2) includes forming the second mask layer by employing a material which dissolves at a second temperature higher than the first temperature; and
    step (a3) includes heating said substrate at a temperature not lower than the first temperature and lower than the second temperature to dissolve only the side surface of the first mask layer.

13. The method according to claim 10, wherein:
    step (a1) includes forming the first mask layer by employing an organic material which contracts by being heated;
    step (a2) includes forming the second mask layer by employing one of (i) a material having a lower coefficient of thermal contraction than that of the organic material and (ii) a material having a higher contraction start temperature than that of the organic material; and
    step (a3) includes contracting the side surface of the first mask layer by heating.

14. The method according to claim 9, wherein:
    step (a1) includes forming the first mask layer by employing a soft material; and
    step (a2) includes disposing the second mask layer formed by employing a hard material.

15. The method according to claim 14, wherein the soft material includes an organic material.

16. The method according to claim 15, wherein the soft material includes a resist.

17. The method according to claim 14, wherein the hard material includes a metal.

* * * * *